(12) United States Patent
Ryu et al.

(10) Patent No.: US 7,224,176 B2
(45) Date of Patent: May 29, 2007

(54) SEMICONDUCTOR DEVICE HAVING TEST ELEMENT GROUPS

(75) Inventors: Jung-Su Ryu, Seongnam-shi (KR); Eun-Han Kim, Suwon-shi (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 10/428,130

(22) Filed: May 2, 2003

(65) Prior Publication Data

US 2004/0017217 A1 Jan. 29, 2004

(30) Foreign Application Priority Data

Jul. 26, 2002 (KR) ............... 10-2002-0044225

(51) Int. Cl.
*G01R 31/02* (2006.01)
(52) U.S. Cl. .................................... 324/763
(58) Field of Classification Search ............... 324/754, 324/758, 765, 757, 158.1, 761, 755; 438/14, 438/17, 18; 365/201; 257/48, 618
See application file for complete search history.

(56) References Cited

U.S. PATENT DOCUMENTS

| | | | | |
|---|---|---|---|---|
| 5,059,899 A | * | 10/1991 | Farnworth et al. | 324/73.1 |
| 6,121,677 A | * | 9/2000 | Song et al. | 257/692 |
| 6,291,835 B1 | * | 9/2001 | Tsuji et al. | 257/48 |
| 6,404,217 B1 | * | 6/2002 | Gordon | 324/763 |
| 6,468,825 B1 | * | 10/2002 | Machida et al. | 438/48 |
| 6,838,891 B2 | * | 1/2005 | Ohya et al. | 324/754 |
| 2002/0145442 A1 | * | 10/2002 | Kinoshita | 324/765 |
| 2004/0017217 A1 | * | 1/2004 | Ryu et al. | 324/763 |

FOREIGN PATENT DOCUMENTS

| | | |
|---|---|---|
| KR | 20000008137 A | 2/2000 |
| KR | 20010029742 A | 4/2001 |
| KR | 1020020082757 A | 10/2002 |
| WO | WO 97/13226 * | 4/1997 |

* cited by examiner

*Primary Examiner*—Jermele Hollington
(74) *Attorney, Agent, or Firm*—Volentine & Whitt, PLLC

(57) ABSTRACT

A plurality of chip regions are defined over a surface of a semiconductor substrate and separated from one another by a scribe region. A plurality of main pads are disposed in the chip regions and a test element group is disposed at the scribe region. The test element group is electrically connected to the main pads through interconnections.

17 Claims, 9 Drawing Sheets

SEMICONDUCTOR DEVICE HAVING TEST ELEMENT GROUPS

BACKGROUND OF THE INVENTION

1. Field of the Invention

The present invention relates to semiconductor devices and, more specifically, to semiconductor devices having test element groups for testing characteristics of a device at a chip region.

2. Description of the Related Art

In general, a plurality of chip regions are defined on a wafer and an integrated circuit is formed at each of the chip regions in order to fabricate a semiconductor device. When a fabrication process is completed, characteristics of a device are tested so as to detect whether the device operates normally. Thus, a test element group is formed at a predetermined region of a wafer to test electrical characteristics of the semiconductor device. Chip regions into which the semiconductor chip is divided are conventionally separated from each other by a predetermined distance. A space between the chip regions is called a "scribe region". The test element group includes various kinds of test elements to test several electrical characteristics.

FIG. 1 illustrates a typical semiconductor device. Referring to FIG. 1, a plurality of main chips are formed on a wafer. A space between chip regions 2 is a scribe region 4 which separates the chip regions from each other after a fabricating process is completed. A plurality of test regions 6 are ordinarily disposed at the scribe region 4 to test electrical characteristics of the semiconductor device in the wafer.

FIG. 2 is a view showing a conventional arrangement of a test element group in a semiconductor device. Referring to FIG. 2, a test element group 10 having a plurality of test patterns is disposed at a scribe region 4 between chip regions 2. A plurality of test pads 12 are disposed at both sides of the test element group 10. The test pads 12 are connected to any test element constituting the test element group 10 through interconnections 14. Main pads 8 for inputting/outputting electrical signals to a chip region are disposed at edges of the chip regions 2.

Although wide scribe regions are needed to divide semiconductor devices in the background art, there is a desire to decrease a width of the scribe region consistent with advances in developing precise apparatuses. However, in the conventional semiconductor devices, test pads are disposed at both sides of a test element group, so that it is difficult to decrease a width of the scribe region.

SUMMARY OF THE INVENTION

The present invention is therefore directed to a semiconductor device having scribe regions for test element groups, which substantially overcomes one or more of the problems resulting from limitations and disadvantages of the related art.

It is therefore an object of the present invention to decrease the space of test pads for input/output of an electrical signal to/from a test element group.

It is another object of the present invention to increase the number of chips on a wafer by decreasing a width of the scribe region.

The above and other objects of the invention can be achieved by a semiconductor device having a test element group, wherein the test element group uses main pads disposed at chip regions as input/output terminals. The wafer includes a plurality of chip regions and a scribe region dividing the chip regions. A plurality of main pads are disposed at the chip regions and the test element group is disposed at the scribe region. The test element group is electrically connected to the main pads through interconnections.

In an embodiment of the present invention, the interconnections connect main pads at a chip region adjoining the test element group along one direction thereof to the test element group. Also, a plurality of test pads are further disposed adjacent to another direction of the test element group and interconnections are further added, which electrically connect the test pads to the test element group.

In another embodiment of the present invention, the interconnections connect main pads at chip regions adjacent to both sides of the test element group, to the test element group.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
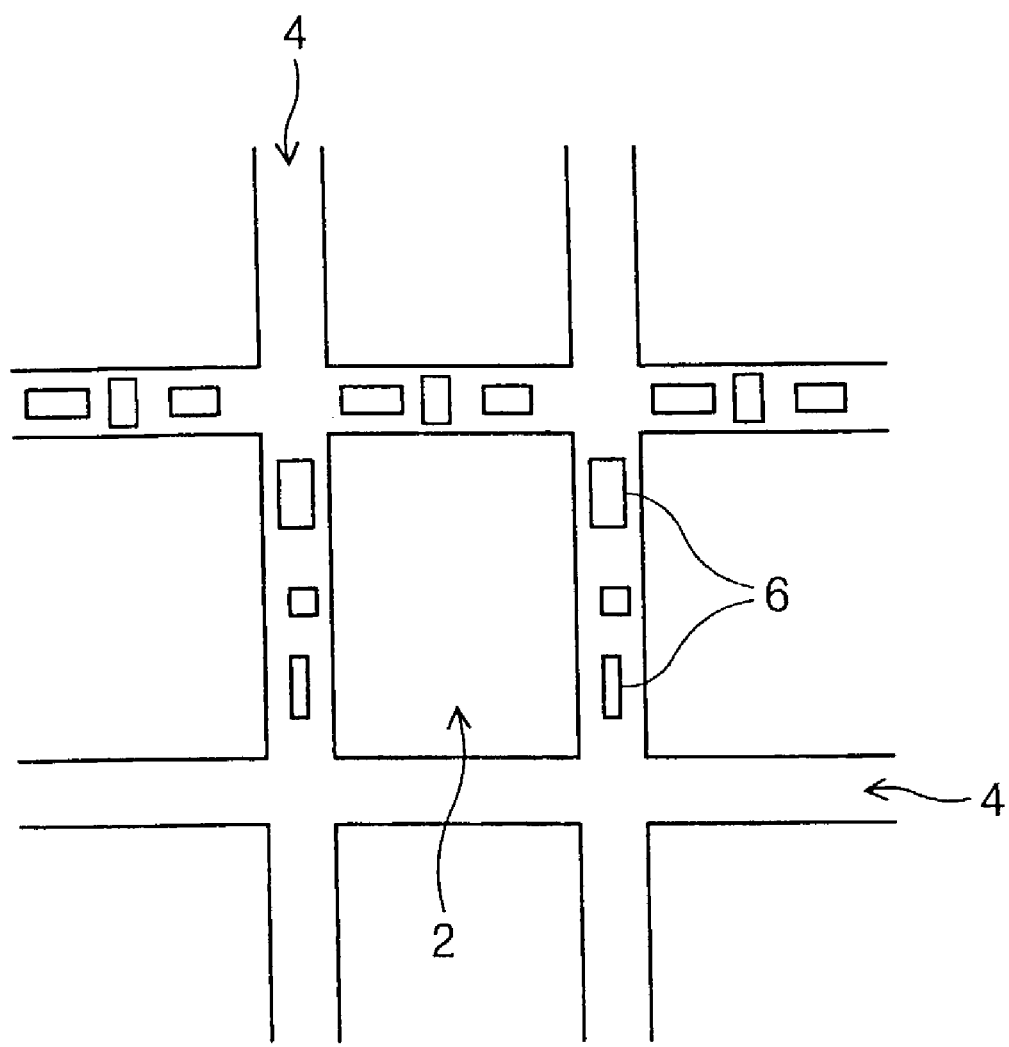
FIGS. 1 and 2 show a typical semiconductor device having a test element group.
Figure 2:
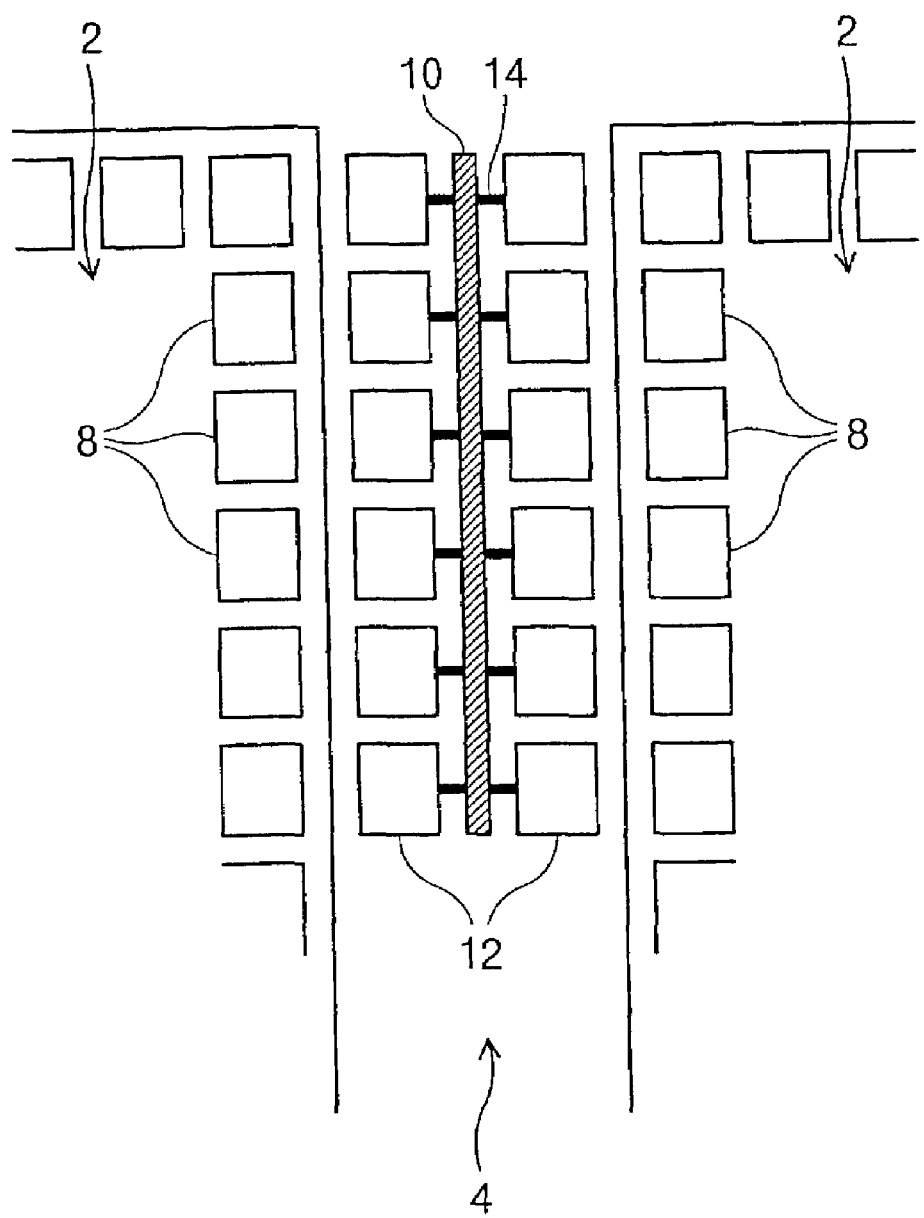

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate or intervening layers may also be present. Like numbers refer to like elements throughout the specification.

Figure 3:
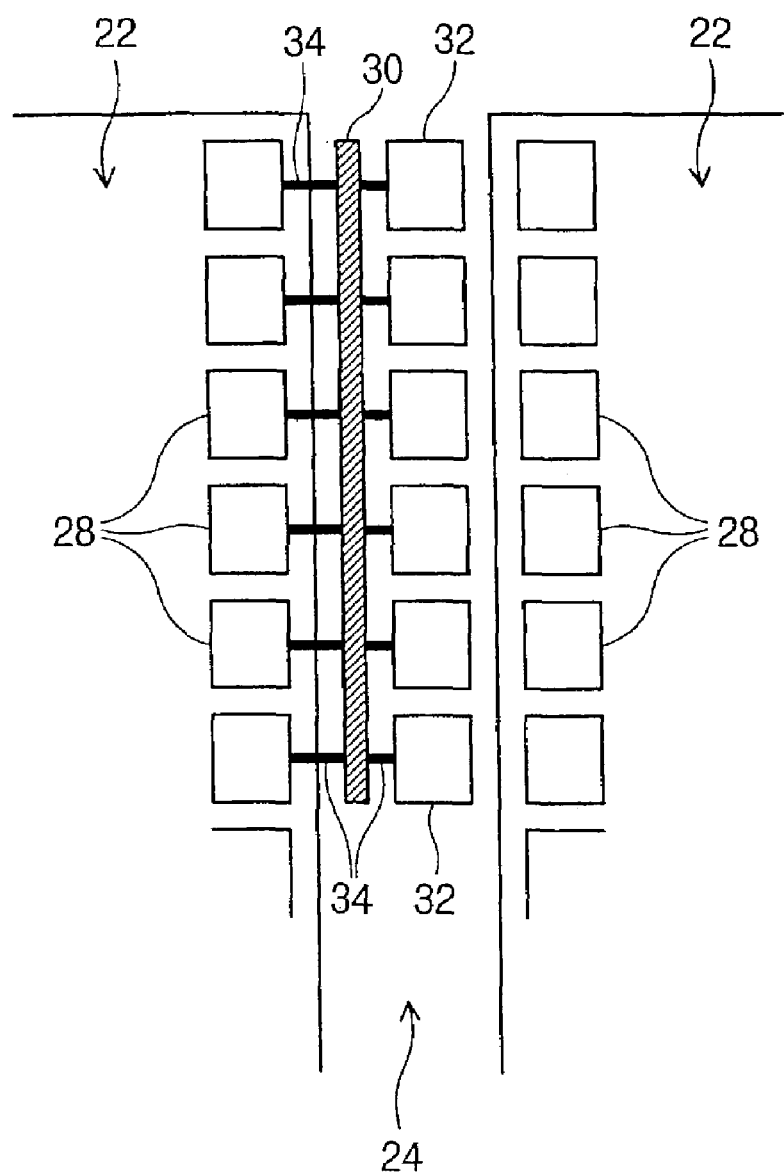
FIGS. 3 through 9 show semiconductor devices having test element groups according to various embodiments of the present invention.

FIG. 3 shows a semiconductor device having a test element group in accordance with a first preferred embodiment of the invention. Referring to FIG. 3, the semiconductor device includes chip regions 22 defined on a wafer and a scribe region 24 dividing the chip regions 22. A test element group 30 is disposed at the scribe region 24. Main chips are formed at the chip regions 22, and also main pads 28 for inputting/outputting electrical signals to the chip region are formed at the chip regions 22. The test element group 30 may include various test elements for testing electrical characteristics of completely fabricated semiconductor devices. The pads are necessary to supply input/output signals to a test element constituting the test element group 30.

According to the first preferred embodiment of the present invention, test pads 32 in FIG. 3 are disposed at the scribe region 24, and the test element group 30 is disposed between the test pads 32 and the main pads 28 of the chip region 22. In addition, the main pads 28 and the test pads 32 adjacent to the test element group 30 are electrically connected to the test element group 30 through interconnections 34 for inputting/outputting electrical signals to the test element group 30. That is to say, the test element group 30 has main pads in common with an adjoining main chip. Thus, a width of a scribe region may be reduced by disposing a less number of test pads in the scribe region than that of test pads conventionally disposed in a scribe region.

Figure 4:
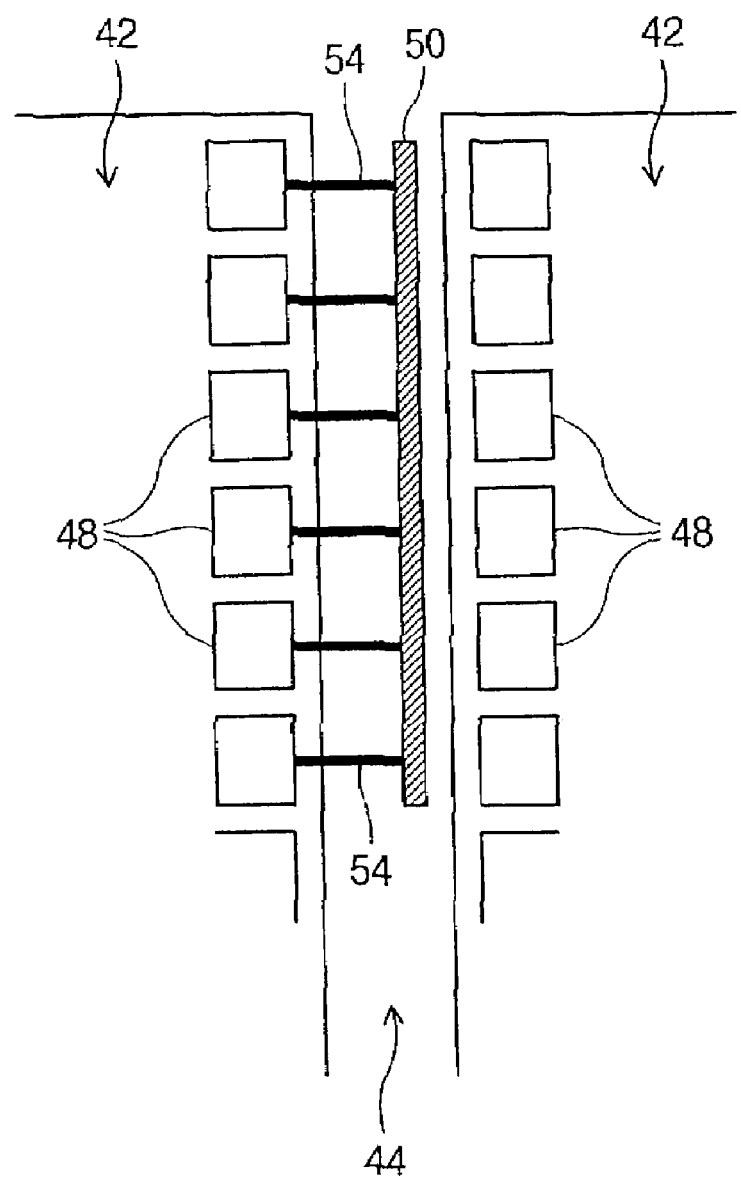

FIG. 4 shows a semiconductor device having a test element group in accordance with a second preferred embodiment of the present invention. Referring to FIG. 4, a semiconductor device according to a second preferred embodiment includes chip regions 42 defined on a wafer and a scribe region 44 dividing the chip regions 42. A test element group 50 is disposed at the scribe region 44. The semiconductor device inputs or outputs electrical signals to the test element group 50 through main pads 48 at the chip region 42 adjacent to the test element group 50. As illustrated in the FIG. 4, the test element group 50 is connected to main pads 48 formed at chip region 42 adjacent to the test element device group 50 along one direction or side thereof, through interconnections 54 in the semiconductor device. Thus, a width of the scribe region 44 may be reduced to a greater extent than in the first embodiment, because additional test pads are not needed.

Figure 5:
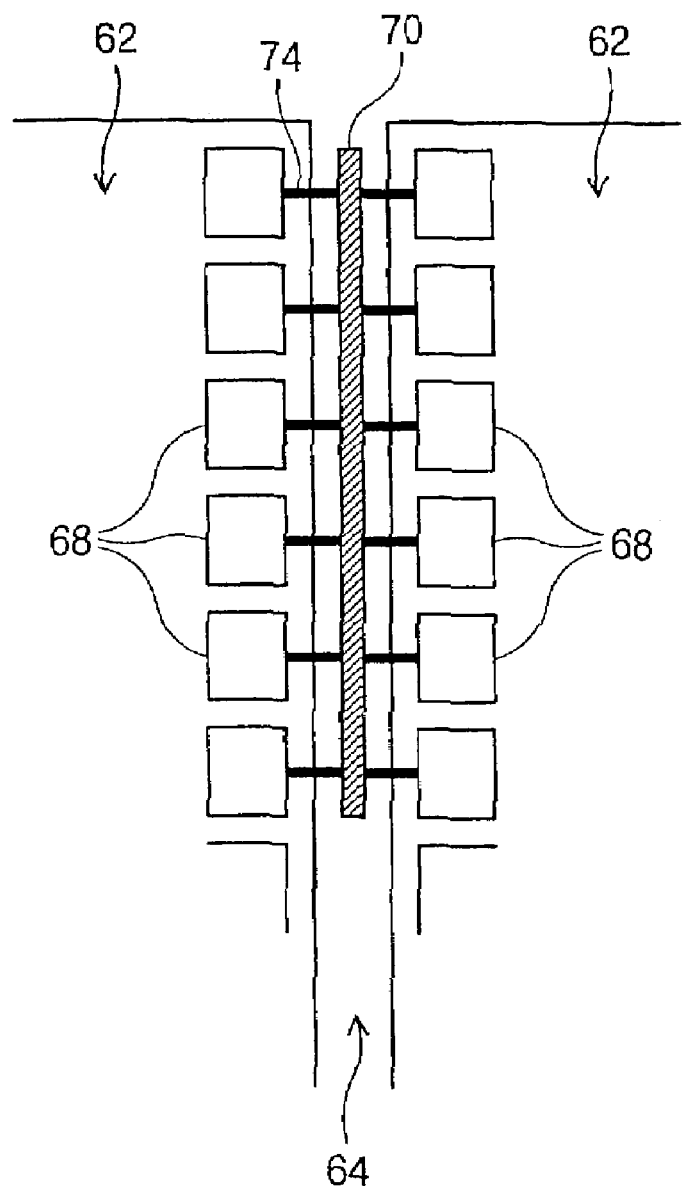

FIG. 5 shows a semiconductor device having a test element group in accordance with a third preferred embodiment of the present invention. Referring to FIG. 5, a semiconductor device in accordance with the third preferred embodiment includes chip regions 62 defined on a wafer, a scribe region 64 between the chip regions 62, and a test element group 70 disposed at the scribe region 64. The test element group 70 is electrically connected to main pads 68 disposed at chip regions 62 adjacent to both sides of the test element group 70, through interconnections 74. Similar to the second preferred embodiment, additional pads are not needed in the third preferred embodiment. Therefore, the width of the scribe region 64 may be reduced.

Figure 6:
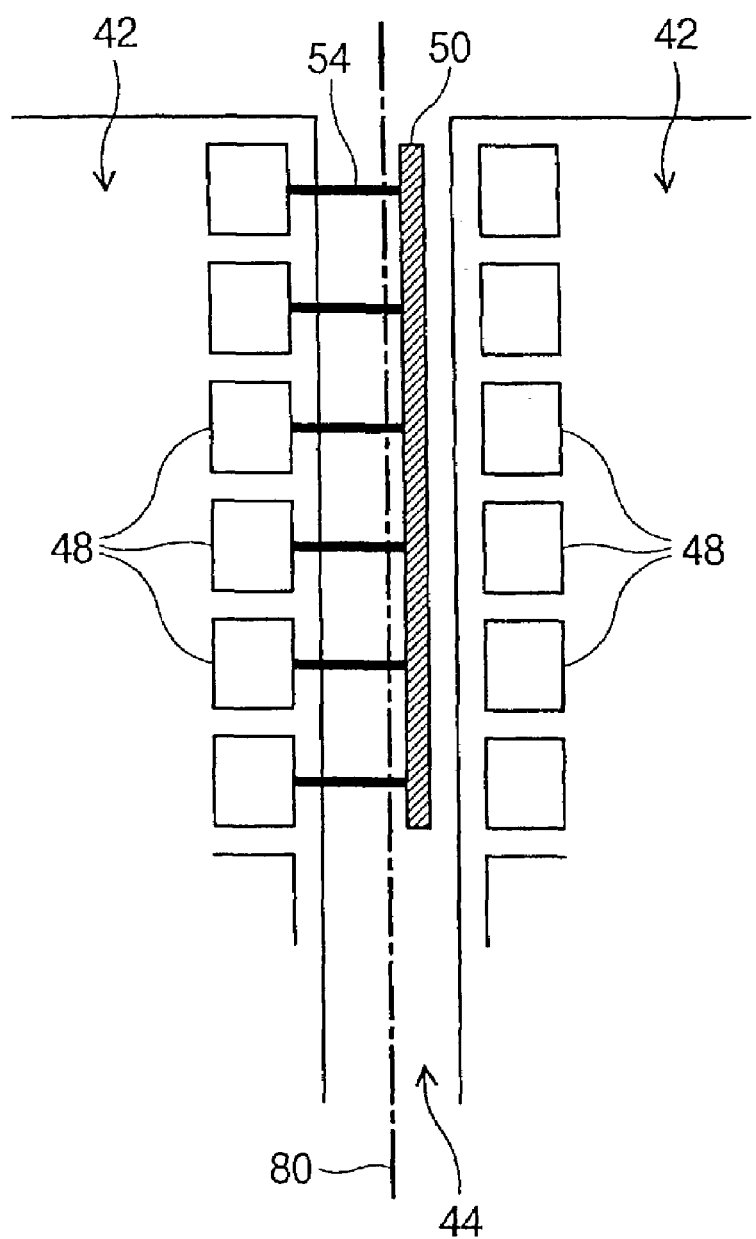

FIGS. 6 through 9 show a semiconductor device having a scribe line 80 for dividing a wafer into chips. Referring to FIG. 6, a semiconductor device in accordance with the second preferred embodiment includes a scribe line 80 defined between main pads 48 and the test element group 50. A plurality of main chips formed on a wafer are cut along the scribe line 80 and divided into separate chips. After cutting, main pads 48 of the divided main chips are therefore electrically connected only to a circuit formed on the corresponding main chip. An interconnection connected to a test element group 50 of a wafer is therefore left electrically floating after cutting. As a result, the main pads 48 serve to input/output electrical signals to the test element group while testing electrical performance of devices. Also, the main pads 48 serve to input/output electrical signals to the main chip while driving the main chip.

Figure 7:
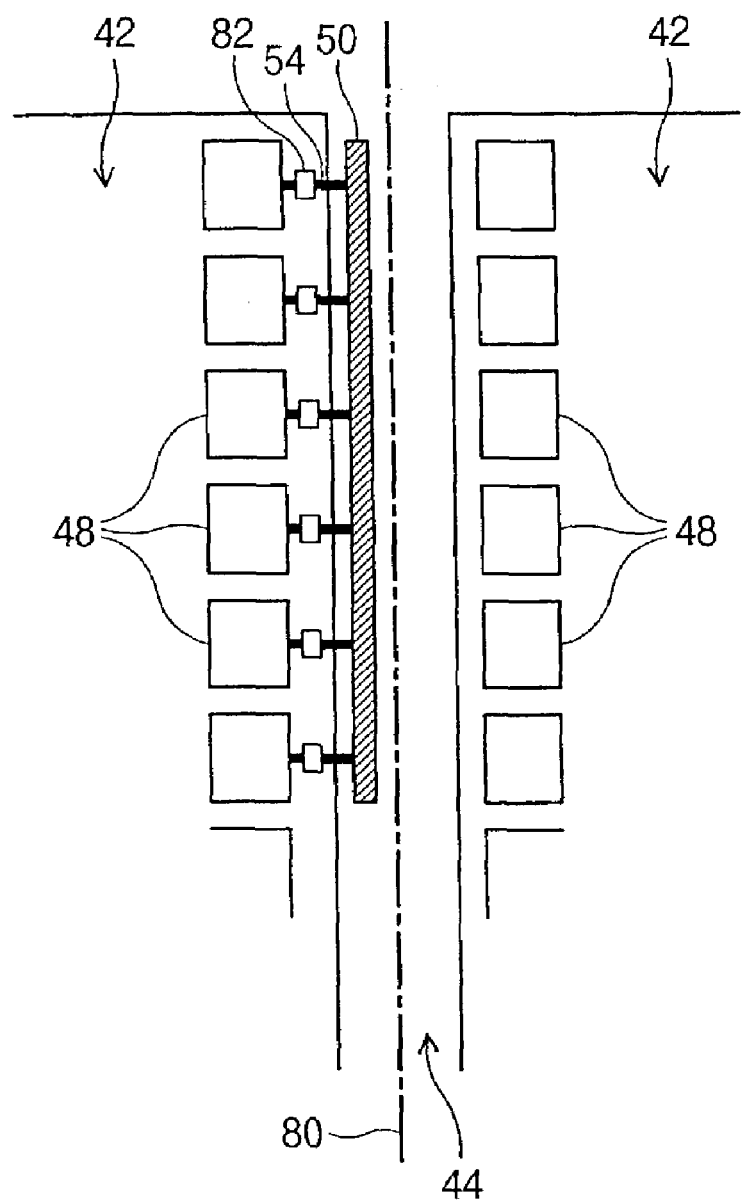

Referring to FIG. 7, the scribe line 80 is defined at a scribe region 44 between the test element group 50 and the main chip 42 which is not connected to the test element group 50. That is to say, the test element group 50 is electrically connected to one of the divided main chips. Switches 82 are formed at interconnections 54 between the test element group 50 and the main pads 48, so as to prevent electrical noise caused by the test element group 50 from affecting the main chip. For example, a fuse region may be formed at the interconnections between the test element group 50 and the main pads 48.

Figure 8:
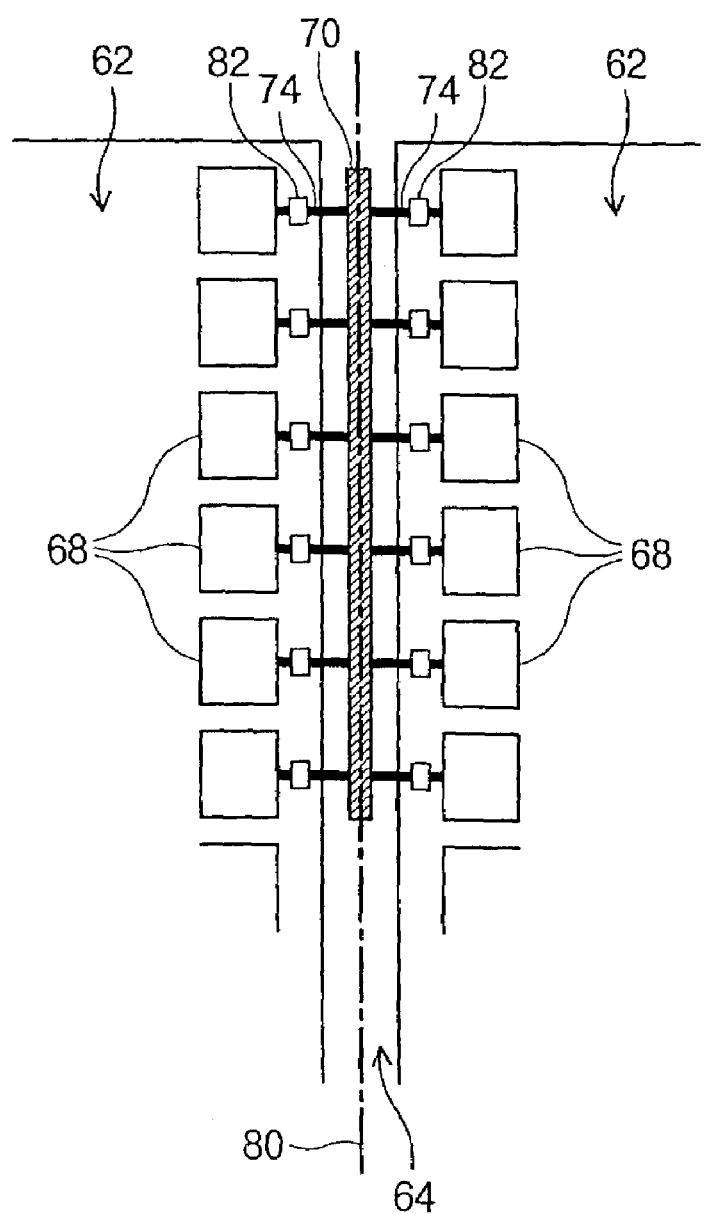

Referring to FIG. 8, the scribe line 80 may be defined at the test element group 70 disposed at the scribe region 64. The main chip 62 divided along the scribe line 80 includes a portion of the test element group 70. Thus, to prevent electrical noise caused by the test element group 70 from affecting the main chip, switches 82 may be formed at interconnections 74 between the test element group 70 and the main pads 68. The switches may be a fuse region.

Figure 9:
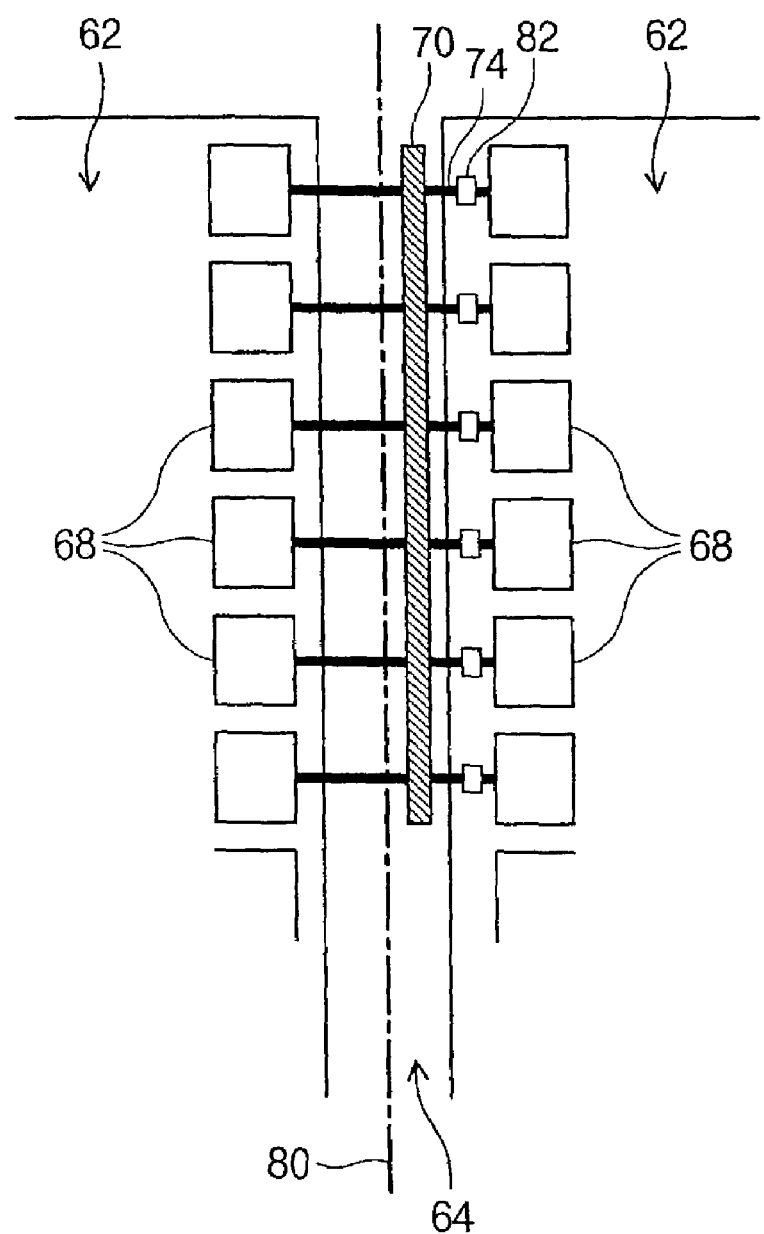

Referring to FIG. 9, the scribe line 80 may be defined between the test element group 70 and main pads 68 adjacent to the test element group 70 along one direction thereof. Thus, the test element group 70 is electrically connected to one of the divided main chips 62. Switches 82 may be formed at interconnections 74 between the test element group 70 and the main pads 68, so as to prohibit electrical noise caused by the test element group 70 from affecting the main chip.

As described above, according to the present invention, a width of a scribe region between main chips is reduced so that more chips may be formed on a wafer. The invention being thus described, it will be apparent that the same may be varied in many ways. For example, the scribe lines as described with respect to FIGS. 6-9 may be located on either side of the test element groups in the various embodiments, such as on the left or right side of test element group 70 in FIG. 8. Also, the switches may be incorporated into any of the various embodiments, such as between any of the main pads and the test element group. Such variations are not to be regarded as a departure from the spirit and scope of the invention, and all such modifications as would be obvious to one skilled on the art are intended to be included within the scope of the following claims.

What is claimed is:

1. A semiconductor device comprising:
   a semiconductor substrate;
   a plurality of chip regions defined over a surface of the semiconductor substrate;
   a scribe region interposed between the chip regions over the surface of the semiconductor substrate;
   a test element group formed in the scribe region, the test element group including test circuits that are tested independently of circuits contained in the chip region;
   a plurality of main pads formed in the chip regions; and
   interconnections which electrically connect the test element group to the main pads to allow testing of the test circuits of the test element group using the main pads.

2. The semiconductor device of claim 1, wherein the interconnections connect the test element group to the main pads at a chip region adjacent to the test element group along one side of the test element group.

3. The semiconductor device of claim 2, further comprising:
   a plurality of test pads disposed adjacent to the test element group along another side of the test element group; and
   second interconnections electrically connecting the test element group to the test pads to allow testing of the test circuits of the test element group using the test pads.

4. The semiconductor device of claim 1, wherein the interconnections connect the test element group to the main pads at the chip regions on both sides of the test element group.

5. A semiconductor device comprising:
a semiconductor substrate;
a plurality of chip regions defined over a surface of the semiconductor substrate;
a scribe region interposed between the chip regions over the surface of the semiconductor substrate;
a test element group formed in the scribe region, the test element group including test circuits that are tested independently of circuits contained in the chip region;
a plurality of main pads formed in the chip regions; and
interconnections which electrically connect the test element group to the main pads at a chip region adjacent and along one side of the test element group, the interconnections allowing testing of the test circuits of the test element group using the main pads and having switches that selectively electrically isolate the main pads from the test element group.

6. The semiconductor device of claim 5, further comprising a scribe line defined at the scribe region between the test element group and the main pads at the one side of the test element group, wherein the switches are formed in the chip regions between the scribe line and the main pads.

7. The semiconductor device of claim 5, wherein the switches are fuses.

8. A semiconductor device comprising:
a semiconductor substrate;
a plurality of chip regions defined over a surface of the semiconductor substrate;
a scribe region interposed between the chip regions over the surface of the semiconductor substrate;
a test element group formed in the scribe region, the test element group including test circuits that are tested independently of circuits contained in the chip region;
a plurality of test pads disposed adjacent to the test element group along one side of the test element group;
a plurality of main pads formed in the chip regions; and
interconnections which electrically connect the test pads and the main pads to the test element group to allow testing of the test circuits of the test element group using the main pads and the test pads, the interconnections having switches which selectively electrically isolate the test element group from the main pads.

9. The semiconductor device of claim 8, further comprising a scribe line defined at the scribe region between the test element group and the main pads, wherein the switches are formed on the chip regions between the scribe line and the test element group.

10. The semiconductor device of claim 8, wherein the switches are fuses.

11. A semiconductor device comprising:
a semiconductor substrate;
a plurality of chip regions defined over a surface of the semiconductor substrate;
a scribe region interposed between the chip regions over the surface of the semiconductor substrate;
a test element group formed in the scribe region, the test element group including test circuits that are tested independently of circuits contained in the chip region;
a plurality of main pads formed in the chip regions; and
interconnections which electrically connect the test element group to the main pads at chip regions adjacent to both sides of the test element group, the interconnections allowing testing of the test circuits of the test element group using the main pads and having switches which selectively electrically isolate the test element group from the main pads.

12. The semiconductor device of claim 11, further comprising a scribe line defined at the scribe region between the test element group and the main pads, wherein the switches are formed on the chip regions between the scribe line and the main pads.

13. The semiconductor device of claim 12, wherein the switches are fuses.

14. The semiconductor device of claim 11, further comprising a scribe line defined at the scribe region within the test element group, the interconnections having switches which selectively electrically isolate the test element group from the main pads.

15. The semiconductor device of claim 14, wherein the switches are formed on chip regions between the main pads and the test element group.

16. The semiconductor device of claim 14, wherein the switches are formed between the test element group and the main pads along the both sides of the test element group.

17. The semiconductor device of claim 14, wherein the switches are fuses.

* * * * *